(12) United States Patent
Aoki et al.

(10) Patent No.: US 7,551,811 B2
(45) Date of Patent: Jun. 23, 2009

(54) OPTICAL DEVICE AND METHOD FOR PRODUCING THE SAME

(75) Inventors: Masami Aoki, Tokyo (JP); Takahiro Matsuse, Tokyo (JP); Hideki Kitano, Tokyo (JP)

(73) Assignee: Bridgestone Corporation, Tokyo (JP)

( * ) Notice: Subject to any disclaimer, the term of this patent is extended or adjusted under 35 U.S.C. 154(b) by 186 days.

(21) Appl. No.: 11/333,330

(22) Filed: Jan. 18, 2006

(65) Prior Publication Data

US 2006/0171627 A1    Aug. 3, 2006

(30) Foreign Application Priority Data

| Jan. 19, 2005 | (JP) | 2005-012056 |
| Apr. 22, 2005 | (JP) | 2005-124852 |
| Dec. 8, 2005 | (JP) | 2005-354491 |

(51) Int. Cl.
  *G02B 6/12* (2006.01)
  *G02B 6/26* (2006.01)
  *G02B 6/42* (2006.01)

(52) U.S. Cl. .................. 385/14; 385/15; 385/31

(58) Field of Classification Search .............. None
See application file for complete search history.

(56) References Cited

U.S. PATENT DOCUMENTS

| 6,396,082 | B1 * | 5/2002 | Fukasawa et al. | 257/79 |
| 6,869,882 | B2 * | 3/2005 | Murali | 438/700 |
| 6,907,151 | B2 * | 6/2005 | Yunus | 385/14 |
| 7,070,207 | B2 * | 7/2006 | Asai | 285/14 |
| 7,162,127 | B2 * | 1/2007 | Ohtsu et al. | 385/49 |
| 7,263,248 | B2 * | 8/2007 | Windover | 385/14 |
| 7,263,256 | B2 * | 8/2007 | Kim et al. | 385/32 |
| 2003/0138231 | A1 * | 7/2003 | Takemura et al. | 385/128 |

FOREIGN PATENT DOCUMENTS

| JP | 2001-185752 A | 7/2001 |
| JP | 2004-004426 A | 1/2004 |
| JP | 2004-004427 A | 1/2004 |

* cited by examiner

*Primary Examiner*—Michelle R. Connelly-Cushwa
*Assistant Examiner*—Chris Chu
(74) *Attorney, Agent, or Firm*—Sughrue Mion, PLLC

(57) ABSTRACT

An optical device includes an optical waveguide, an optical element, and a resin layer disposed between the optical waveguide and the optical element. The resin layer is formed of a photocurable material alone or in combination with a thermosetting material and includes an optical interconnect for optically connecting the optical waveguide and the optical element. The optical interconnect has a higher refractive index than a region of the resin layer around the optical interconnect. A method for producing the optical device includes providing the photocurable material between the optical waveguide and the optical element, partially irradiating the photocurable material with light to form the optical interconnect, and secondarily irradiating the overall photocurable material with light to cure the overall resin layer.

8 Claims, 1 Drawing Sheet

OPTICAL DEVICE AND METHOD FOR PRODUCING THE SAME

BACKGROUND OF THE INVENTION

1. Field of the Invention

The present invention relates to optical devices and methods for producing the devices, and specifically to an optical device having an improved optical interconnection structure between optical waveguides and optical elements and a method for producing the device.

2. Description of the Related Art

Optical interconnection technology has recently been introduced to electronic circuit boards for electronic devices to achieve higher signal transmission speeds. Specifically, an optical waveguide is stacked on an electronic circuit layer for use as an optical interconnect in a circuit board. A circuit board having both electronic and optical interconnects is generally called an optical electronic integrated circuit board.

FIG. 2 shows an example of an optical electronic integrated circuit board. In FIG. 2, an optical electronic integrated circuit board 200 includes a printed circuit board 10 including optical waveguides 11 and an IC-chip mounting substrate 20 on which a vertical cavity surface-emitting laser (VCSEL) 22 and a photodiode (PD) 23 are mounted. The IC-chip mounting substrate 20 is flip-flop mounted on the printed circuit board 10 with bump electrodes 31 and soldering balls 32 disposed therebetween. This optical electronic integrated circuit board 200 is used as an optical device by connecting it to an optical fiber (not shown) through a connector 40. An important challenge for such optical devices is the reduction of connection loss between optical components.

As examples of techniques for improving such optical devices, Japanese Unexamined Patent Application Publications No. 2004-4426 and 2004-4427 (see, for example, the claims of the publications) disclose optical communication devices that include an underfill layer for optical paths or optical signal transmission lines through which optical signals are transmitted between optical waveguides and optical elements to reduce the connection loss between optical components and achieve excellent connection reliability. In addition, Japanese Unexamined Patent Application Publication No. 2001-185752 (see, for example, the claims of the publication) discloses a technique for reducing optical loss by providing microlenses in an optical path of signal light between a surface-emitting element and an optical waveguide. Another technique is the use of right-angle bending elements for reducing optical loss.

As described above, various techniques for reducing connection loss between optical waveguides and optical elements have been proposed. The techniques using microlenses or right-angle bending elements, however, have difficulty in positioning them when they are mounted on an optical electronic integrated circuit board. In the mounting of optical elements on the circuit board, additionally, the positions thereof must be adjusted to those of the microlenses or the right-angle bending elements mounted on the circuit board. As a result, such techniques undesirably involve a larger number of steps for mounting. Furthermore, foreign matter can intrude into an optical path of signal light, obstruct transmission, and cause optical loss.

The transmission of optical signals between optical waveguides and optical elements through an underfill layer for optical paths or optical signal transmission lines, as disclosed in the above publications, is unsatisfactory, and techniques for optical connection with lower loss are demanded.

SUMMARY OF THE INVENTION

Accordingly, an object of the present invention is to provide an optical device that has an improved optical interconnection structure between optical waveguides and optical elements to reduce connection loss and achieve excellent optical connection characteristics and also provide a method for producing the optical device.

As a result of an intensive study, the present inventors have found that optical waveguides and optical elements can be optically connected with lower loss than ever before by providing a resin layer therebetween and forming predetermined optical interconnects in the resin layer.

To achieve the above object, the present invention provides an optical device including an optical waveguide, an optical element, and a resin layer disposed between the optical waveguide and the optical element. The resin layer is formed of a photocurable material and includes an optical interconnect for optically connecting the optical waveguide and the optical element. The optical interconnect has a higher refractive index than a region of the resin layer around the optical interconnect. The photocurable material preferably contains at least two photopolymerization initiators. In addition, the photocurable material preferably contains at least one dye that absorbs light in the near-infrared or longer wavelength region.

The present invention further provides a method for producing the optical device. This method includes providing the photocurable material between the optical waveguide and the optical element, partially irradiating the photocurable material with light to form the optical interconnect, and secondarily irradiating the overall photocurable material with light to cure the overall resin layer.

The present invention further provides another optical device including an optical waveguide, an optical element, and a resin layer disposed between the optical waveguide and the optical element. The resin layer is formed of a photocurable material and a thermosetting material and includes an optical interconnect for optically connecting the optical waveguide and the optical element. The optical interconnect has a higher refractive index than a region of the resin layer around the optical interconnect. Preferably, the photocurable material contains at least one photopolymerization initiator, and the thermosetting material contains at least one thermal polymerization initiator. In addition, the photocurable material preferably contains at least one dye that absorbs light in the near-infrared or longer wavelength region.

The present invention further provides a method for producing the optical device. This method includes providing a mixture of the photocurable material and the thermosetting material between the optical waveguide and the optical element, partially irradiating the mixture with light to form the optical interconnect, and heating the overall mixture to cure the overall resin layer.

In the optical devices according to the present invention, the optical element is preferably mounted on a circuit board having the optical waveguide with soldering balls. In addition, the optical element is preferably a light-emitting element or a photodetector.

In the methods for producing the optical devices according to the present invention, the partial irradiation is preferably carried out with light emitted from the optical element or light that is emitted from an external light source to reach the optical element through the optical waveguide. More preferably, the partial irradiation is carried out with both light emitted from the optical element and light that is emitted from an external light source to reach the optical element through the optical waveguide.

The present invention, as described above, can provide an optical device that causes less optical loss between an optical waveguide and an optical element than ever before and has excellent optical connection characteristics, and can also provide a method for producing the optical device.

DESCRIPTION OF THE PREFERRED EMBODIMENTS

Preferred embodiments of the present invention will now be described in detail.

Figure 1:
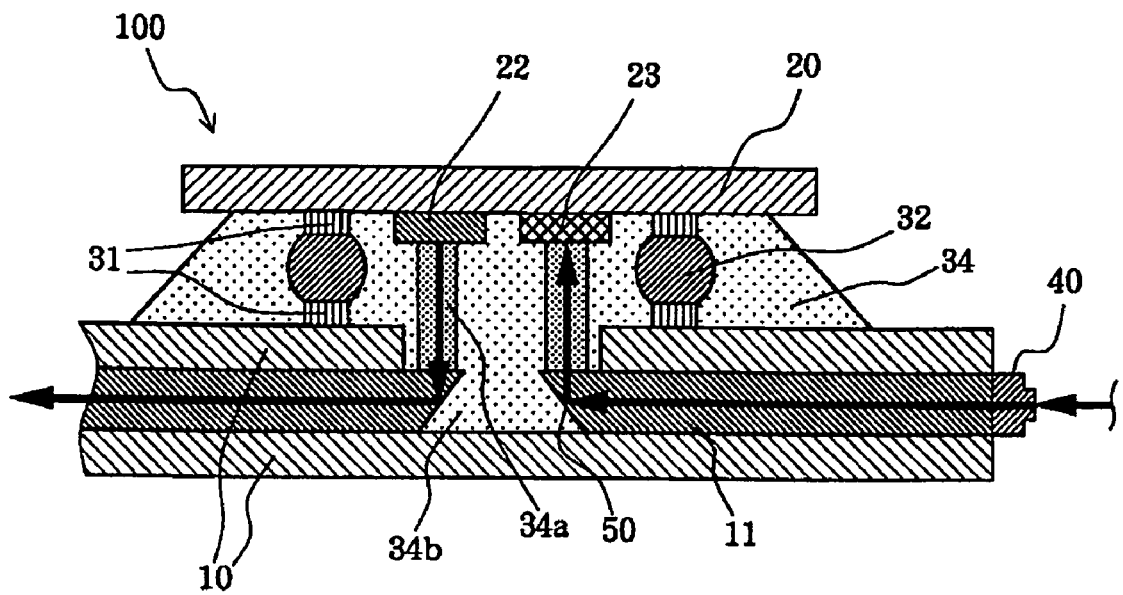
FIG. 1 is a schematic sectional view of an optical device according to a preferred embodiment of the present invention.
Figure 2:
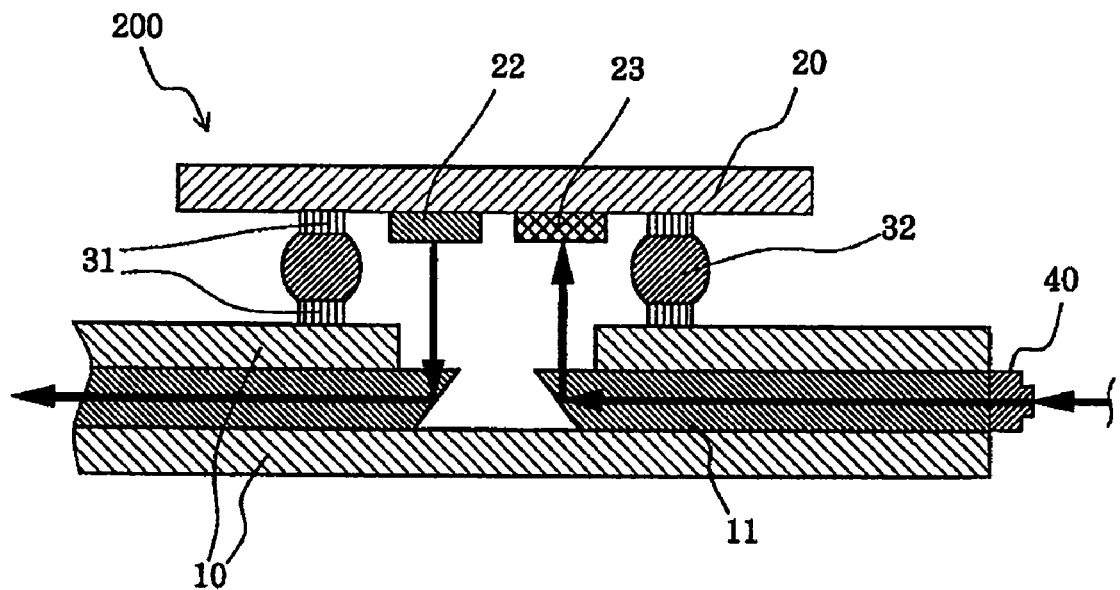
FIG. 2 is a schematic sectional view of an example of a known optical device.

FIG. 1 is a schematic sectional view of an optical device according to a preferred embodiment of the present invention. In FIG. 1, an optical device 100 includes a printed circuit board 10 including optical waveguides 11 and an IC-chip mounting substrate 20 on which a vertical cavity surface-emitting laser (VCSEL) 22 and a photodiode (PD) 23 (optical elements 22 and 23) are mounted. The printed circuit board 10 is flip-flop mounted on the IC-chip mounting substrate 20 with bump electrodes 31 and soldering balls 32 disposed therebetween. This structure is similar to known structures.

In the present invention, a resin layer (underfill material) 34 is provided between the printed circuit board 10 and the IC-chip mounting substrate 20, that is, between the optical waveguides 11 and the optical elements 22 and 23. This resin layer 34 is formed of a photocurable material alone or in combination with a thermosetting material. Optical interconnects 34a are formed in the resin layer 34 to optically connect the optical waveguides 11 and the optical elements 22 and 23. These optical interconnects 34a have a higher refractive index than the surrounding region 34b to form an optical waveguide structure including the optical interconnects 34a as cores in the resin layer 34. The optical interconnects 34a can therefore transmit light between the optical waveguides 11 and the optical elements 22 and 23 with inhibited optical loss. To further inhibit the optical loss, a suitable numerical aperture (NA) may be selected by adjusting the reflective indices of the optical interconnects 34a and the surrounding region 34b.

In the present invention, as described above, the resin layer 34 is formed of a photocurable material alone or in combination with a thermosetting material. Examples of the photocurable material used are classified into (a) dichromate-based photosensitive resins, (b) photodegradable resins, (c) photodimerizable resins, and (d) photopolymerizable resins.

Examples of (a) dichromate-based photosensitive resins include natural polymers (e.g., gelatin, glues, egg whites, gum arabic, and ceramics) or synthetic polymers (e.g., polyvinyl alcohol (PVA) and polyacrylamide) containing ammonium dichromate or potassium dichromate. Examples of (b) photodegradable resins include aromatic diazonium salt-based resins, o-quinone diazide resins, and azide-containing resins. Examples of (c) photodimerizable resins include cinnamate resins.

Examples of (d) photopolymerizable resins include radical photopolymerizable compositions, which are based on the radical polymerization of unsaturated double bonds; photo- addition compositions, which are based on the addition of thiol groups to double bonds; and cationic photopolymerizable compositions, which are based on the ring-opening addition reaction of epoxy groups (cationic polymerization). The photopolymerizable resins are mainly composed of a reactive polymer having a photopolymerizable group, a compound (monomer or oligomer) having a photopolymerizable group (preferably, a (meth)acryloyl group), a photopolymerization initiator, and other optional additives.

Examples of the reactive polymer having a photopolymerizable group include homopolymers and copolymers of alkyl acrylates and alkyl methacrylates (namely, acrylic resins) which have a photopolymerizable group on the main chains or side chains of the polymers. Examples of the acrylates include alkyl acrylates such as methyl acrylate, ethyl acrylate, butyl acrylate, and 2-ethylhexyl acrylate; and alkyl methacrylates such as methyl methacrylate, ethyl methacrylate, butyl methacrylate, and 2-ethylhexyl methacrylate. Such polymers may be prepared by, for example, copolymerizing at least one (meth)acrylate and a (meth)acrylate having a functional group such as a hydroxyl group and reacting the resultant polymer with a compound, such as an isocyanatoalkyl(meth) acrylate, that can react with the functional group of the polymer and has a photopolymerizable group. Accordingly, acrylic resins having a photopolymerizable group with a urethane bond are preferred.

The reactive polymer preferably contains 1 to 50 mole percent, more preferably 5 to 30 mole percent, of the photopolymerizable group. The photopolymerizable group is preferably an acryloyl, methacryloyl, or vinyl group, particularly preferably an acryloyl or methacryloyl group. In addition, the reactive polymer generally has a glass transition temperature of 20° C. or less, a number average molecular weight of 5,000 to 1,000,000, preferably 10,000 to 300,000, and a weight average molecular weight of 5,000 to 1,000,000, preferably 10,000 to 300,000.

The compound having a photopolymerizable group is exemplified by (meth)acrylate monomers and oligomers. Examples of (meth)acrylate monomers include 2-hydroxyethyl (meth)acrylate, 2-hydroxypropyl(meth)acrylate, 4-hydroxybutyl(meth)acrylate, 2-ethylhexyl polyethoxy (meth) acrylate, benzyl(meth)acrylate, isobornyl (meth)acrylate, phenyloxyethyl(meth)acrylate, tricyclodecane mono(meth) acrylate, dicyclopentenyloxyethyl (meth)acrylate, tetrahydrofurfuryl(meth)acrylate, acryloyl morpholine, N-vinylcaprolactam, 2-hydroxy-3-phenyloxypropyl (meth)acrylate, o-phenylphenyloxyethyl(meth)acrylate, neopentyl glycol di(meth)acrylate, neopentyl glycol dipropoxy di(meth)acrylate, hydroxypivalic acid neopentyl glycol di(meth)acrylate, tricyclodecanedimethylol di(meth)acrylate, 1,6-hexanediol di(meth)acrylate, nonanediol di(meth)acrylate, trimethylolpropane tri(meth)acrylate, pentaerythritol tri(meth)acrylate, pentaerythritol tetra(meth)acrylate, tris[(meth)acryloxyethyl]isocyanurate, and ditrimethylolpropane tetra(meth) acrylate. Examples of (meth)acrylate oligomers include polyurethane (meth)acrylates produced by the reaction of polyols, organic polyisocyanates, and hydroxyl-containing (meth) acrylates; and bisphenol epoxy(meth)acrylates produced by the reaction of bisphenol epoxy resins, such as bisphenol-A epoxy resins and bisphenol-F epoxy resins, with (meth) acrylic acid. Examples of polyols include polyols such as ethylene glycol, propylene glycol, neopentyl glycol, 1,6-hexanediol, 3-methyl-1,5-pentanediol, 1,9-nonanediol, 2-ethyl-2-butyl-1,3-propanediol, trimethylolpropane, diethylene glycol, dipropylene glycol, polypropylene glycol, 1,4-dimethylolcyclohexane, bisphenol-A polyethoxydiol, and polytetramethylene glycol; polyester polyols produced by the reaction of the above polyols with polybasic acids, such as succinic acid, maleic acid, itaconic acid, adipic acid, hydrogenated dimer acid, phthalic acid, isophthalic acid, and terephthalic acid, or anhydrides thereof; polycaprolactone polyols produced by the reaction of the above polyols with ε-caprolactone; products of the reaction of the above polyols and the polybasic acids or anhydrides thereof with ε-caprolactone; polycarbonate polyols; and polymer polyols. Examples of organic polyisocyanates include tolylene diisocyanate, isophorone diisocyanate, xylylene diisocyanate, diphenylmethane-4,4'-diisocyanate, dicyclopentanyl diisocyanate, hexamethylene diisocyanate, 2,4,4'-trimethylhexamethylene diisocyanate, and 2,2',4'-trimethylhexamethylene diisocyanate. Examples of hydroxyl-containing (meth) acrylates include 2-hydroxyethyl (meth)acrylate, 2-hydroxypropyl(meth)acrylate, 4-hydroxybutyl(meth)acrylate, 2-hydroxy-3-phenyloxypropyl (meth)acrylate, cyclohexane-1,4-dimethylol mono(meth)acrylate, pentaerythritol tri(meth)acrylate, and glycerol di(meth)acrylate. The compound having a photopolymerizable group may be used alone or in combination of two or more of them.

The photopolymerization initiator used may be any known photopolymerization initiator; it preferably has high storage stability after being added. Examples of such photopolymerization initiators include acetophenones such as 2-hydroxy-2-methyl-1-phenylpropane-1-on, 1-hydroxycyclohexyl phenyl ketone, and 2-methyl-1-[4-(methylthio)phenyl]-2-morphorinopropane-1-on; benzoins such as benzyl dimethyl ketal; benzophenones such as benzophenone, 4-phenylbenzophenone, and hydroxybenzophenone; thioxanthones such as isopropylthioxanthone and 2,4-diethylthioxanthone; acylphosphine oxides; and other special initiators such as methyl phenyl glyoxylate. Particularly preferred are 2-hydroxy-2-methyl-1-phenylpropane-1-on, 1-hydroxycyclohexyl phenyl ketone, 2-methyl-1-[4-(methylthio)phenyl]-2-morphorinopropane-1-on, and benzophenone. If necessary, the photopolymerization initiator may be used by mixing it with at least one known photopolymerization accelerator, such as a benzoic acid (e.g., 4-dimethylaminobenzoic acid) or a tertiary amine, in any ratio. Alternatively, the photopolymerization initiator may be used alone or in combination of two or more. The photopolymerization initiator is preferably added to the photopolymerizable resin in an amount of 0.1% to 20% by weight, more preferably 1% to 10% by weight.

Other examples of acetophenone photopolymerization initiators include 4-phenoxydichloroacetophenone, 4-t-butyldichloroacetophenone, 4-t-butyltrichloroacetophenone, diethoxyacetophenone, 1-(4-isopropylphenyl)-2-hydroxy-2-methylpropane-1-on, 1-(4-dodecylphenyl)-2-hydroxy-2-methylpropane-1-on, and 4-(2-hydroxyethoxy)phenyl(2-hydroxy-2-propyl)ketone. Other examples of benzophenone photopolymerization initiators include benzoylbenzoic acid, methyl benzoylbenzoate, 4-benzoyl-4'-methyldiphenyl sulfide, and 3,3'-dimethyl-4-methoxybenzophenone. Examples of acylphosphine oxide photopolymerization initiators include 2,4,6-trimethylbenzoyldiphenylphosphine oxide and bis(2,6-dimethoxybenzoyl)-2,4,4-trimethylpentylphosphine oxide.

Among the above acetophenone photopolymerization initiators, 2-hydroxy-2-methyl-1-phenylpropane-1-on, 1-hydroxycyclohexyl phenyl ketone, and 2-methyl-1-[4-(methylthio)phenyl]-2-morphorinopropane-1-on are particularly preferred. Among the above benzophenone photopolymerization initiators, benzophenone, benzoylbenzoic acid, and methyl benzoylbenzoate are preferred.

Examples of the tertiary amine photopolymerization accelerator used include triethanolamine, methyldiethanolamine, triisopropanolamine, 4,4'-dimethylaminobenzophenone, 4,4'-diethylaminobenzophenone, ethyl 2-dimethylaminobenzoate, ethyl 4-dimethylaminobenzoate, (n-butoxy) ethyl 4-dimethylaminobenzoate, isoamyl 4-dimethylaminobenzoate, and 2-ethylhexyl 4-dimethylaminobenzoate. Particularly preferred are ethyl 4-dimethylaminobenzoate, (n-butoxy)ethyl 4-dimethylaminobenzoate, isoamyl 4-dimethylaminobenzoate, and 2-ethylhexyl 4-dimethylaminobenzoate. Thus the photopolymerization initiator is generally used in a combination of the above three components.

The ratio by weight between the reactive polymer, the compound having a photopolymerizable group, and the photopolymerization initiator in the photopolymerizable resin is generally 40 to 100:0 to 60:0.1 to 10, particularly 60 to 100:0 to 40:1 to 10.

As cationic photopolymerizable compositions, examples of polymerizable monomers having one oxetane ring include 3-ethyl-3-hydroxymethyloxetane, 3-(meth)allyloxymethyl-3-ethyloxetane, (3-ethyl-3-oxetanylmethoxy)methylbenzene, 4-fluoro-[1-(3-ethyl-3-oxetanylmethoxy)methyl]benzene, 4-methoxy-[1-(3-ethyl-3-oxetanylmethoxy)methyl]benzene, [1-(3-ethyl-3-oxetanylmethoxy)ethyl]phenyl ether, isobutoxymethyl (3-ethyl-3-oxetanylmethyl)ether, isobornyloxyethyl(3-ethyl-3-oxetanylmethyl)ether, isobornyl(3-ethyl-3-oxetanylmethyl)ether, 2-ethylhexyl(3-ethyl-3-oxetanylmethyl)ether, ethyl diethylene glycol (3-ethyl-3-oxetanylmethyl)ether, dicyclopentadiene (3-ethyl-3-oxetanylmethyl)ether, dicyclopentenyloxyethyl(3-ethyl-3-oxetanylmethyl)ether, dicyclopentenylethyl(3-ethyl-3-oxetanylmethyl)ether, tetrahydrofurfuryl(3-ethyl-3-oxetanylmethyl)ether, tetrabromophenyl(3-ethyl-3-oxetanylmethyl)ether, 2-tetrabromophenoxyethyl(3-ethyl-3-oxetanylmethyl)ether, tribromophenyl(3-ethyl-3-oxetanylmethyl)ether, 2-tribromophenoxyethyl(3-ethyl-3-oxetanylmethyl)ether, 2-hydroxyethyl(3-ethyl-3-oxetanylmethyl)ether, 2-hydroxypropyl(3-ethyl-3-oxetanylmethyl)ether, butoxyethyl(3-ethyl-3-oxetanylmethyl)ether, pentachlorophenyl(3-ethyl-3-oxetanylmethyl)ether, pentabromophenyl(3-ethyl-3-oxetanylmethyl)ether, and bornyl(3-ethyl-3-oxetanylmethyl) ether. Examples of polymerizable monomers having two oxetane rings include 1,4-bis{[(3-ethyl-3-oxetanyl)methoxy]methyl}benzene, bis{[(1-ethyl)$_3$-oxetanyl]methyl}ether, 1,4-bis[(3-ethyl-3-oxetanyl)methoxy]benzene, 1,3-bis[(3-ethyl-3-oxetanyl)methoxy]benzene, 3,7-bis(3-oxetanyl)-5-oxanonane, 1,4-bis[(3-ethyl-3-oxetanylmethoxy)methyl]benzene, 1,2-bis[(3-ethyl-3-oxetanylmethoxy)methyl]ethane, 1,2-bis[(3-ethyl-3-oxetanylmethoxy)methyl]propane, ethylene glycol bis(3-ethyl-3-oxetanylmethyl)ether, dicyclopentenyl bis(3-ethyl-3-oxetanylmethyl)ether, triethylene glycol bis(3-ethyl-3-oxetanylmethyl)ether, tetraethylene glycol bis(3-ethyl-3-oxetanylmethyl)ether, tricyclodecanediyldimethylene bis(3-ethyl-3-oxetanylmethyl)ether, 1,4-bis[(3-ethyl-3-oxetanylmethoxy)methyl]butane, 1,6-bis[(3-ethyl-3-oxetanylmethoxy)methyl]hexane, polyethylene glycol bis(3-ethyl-3-oxetanylmethyl)ether, EO-modified bisphenol-A bis(3-ethyl-3-oxetanylmethyl)ether, PO-modified bisphenol-A bis(3-ethyl-3-oxetanylmethyl)ether, EO-modified hydrogenated bisphenol-A bis(3-ethyl-3-oxetanylmethyl)ether, PO-modified hydrogenated bisphenol-A bis(3-ethyl-3-oxetanylmethyl)ether, and EO-modified bisphenol-F bis(3-ethyl-3-oxetanylmethyl)ether. Examples of polymerizable monomers having three to five oxetane rings include trimethylolpropane tris(3-ethyl-3-oxetanylmethyl)ether, pentaerythritol tris(3-ethyl-3-oxetanylmethyl)

ether, pentaerythritol tetrakis(3-ethyl-3-oxetanylmethyl) ether, and dipentaerythritol pentakis(3-ethyl-3-oxetanylmethyl) ether.

Glycidyl ether epoxy compounds are exemplified by di- or polyglycidyl ethers of polyphenols having an aromatic core or alkylene oxide adducts thereof and di- or polyglycidyl ethers of aliphatic polyols or alkylene oxide adducts thereof. Examples of such compounds include di- or polyglycidyl ethers of bisphenol A, bisphenol F, bisphenol S, hydrogenated bisphenol A, hydrogenated bisphenol F, hydrogenated bisphenol S, bisphenol fluorene, and alkylene oxide adducts thereof; diglycidyl ethers of alkylene glycols such as ethylene glycol, propylene glycol, 1,4-butanediol, 1,6-hexanediol, and alkylene oxide adducts thereof; diglycidyl ethers of polyalkylene glycols such as polyethylene glycol and polypropylene glycol; diglycidyl ethers of neopentyl glycol, dibromoneopentyl glycol, and alkylene oxide adducts of the glycols; di- or triglycidyl ethers of trimethylolethane, trimethylolpropane, glycerin, and alkylene oxide adducts of the triols; polyglycidyl ethers of polyaltols, such as a di-, tri- or tetra glycidyl ether of pentaerythritol, and alkylene oxide adducts thereof; novolac epoxy resins: cresol novolac resins; and those compounds with a halogen-substituted aromatic core.

Alicyclic epoxy compounds are exemplified by compounds containing cyclohexene oxide or cyclopentene oxide, which are produced by epoxidating a compound having a cycloalkene ring, such as a cyclohexene ring or a cyclopentene ring, with an appropriate oxidizing agent, such as hydrogen peroxide or a peracid. Examples of the compounds include 3,4-epoxycyclohexylmethyl-3',4'-epoxycyclohexane carboxylate, 2-(3,4-epoxycyclohexyl-5,5-spiro-3,4-epoxy)cyclohexane-meta-dioxane, bis(3,4-epoxycyclohexylmethyl) adipate, vinylcyclohexene oxide, 4-vinylepoxycyclohexane, bis(3,4-epoxy-6-methylcyclohexylmethyl) adipate, 3,4-epoxy-6-methylcyclohexyl-3',4'-epoxy-6'-methylcyclohexane carboxylate, methylene bis(3,4-epoxycyclohexane), dicyclopentadiene diepoxide, ethylene glycol di(3,4-epoxycyclohexylmethyl)ether, ethylene bis(3,4-epoxycyclohexane carboxylate), epoxidized tetrabenzyl alcohol, lactone-modified 3,4-epoxycyclohexylmethyl-3',4'-epoxycyclohexane carboxylate, lactone-modified epoxidized tetrahydrobenzyl alcohol, and cyclohexene oxide. Also, spiroorthocarbonates may be used as cationic polymerizable compounds.

Cationic photopolymerization initiator products are commercially available under the trade names of, for example, UVI-6950, UVI-6970 (bis[4-(di(4-(2-hydroxyethyl)phenyl)sulfonio)phenyl sulfide]), UVI-6974 (a mixture of bis[4-diphenylsulfonio]phenyl)sulfide bis(hexafluoroantimonate) and diphenyl-4-thiophenoxyphenylsulfonium hexafluoroantimonate), and UVI-6990 (a hexafluorophosphate of UVI 6974), manufactured by Union Carbide Corporation; ADEKA Optomer SP-151, SP-170 (bis[4-(di(4-(2-hydroxyethyl)phenyl)sulfonio)phenyl sulfide]), and SP-150 (a hexafluorophosphate of SP-170), manufactured by Asahi Denka Co., Ltd.; Irgacure® 261 ($\eta^5$-2,4-cyclopentadiene-1-yl-[(1,2,3,4,5,6-$\eta$)-(1-methylethyl)benzene]-iron (1+)-hexafluorophosphate(1−)), manufactured by Ciba Specialty Chemicals; CI-2481, CI-5102, CI-2855, and CI-2064, manufactured by Nippon Soda Co., Ltd.; KI85, CD-1010, CD-1011, and CD-1012 (4-(2-hydroxytetradecanyloxy) diphenyliodonium hexafluoroantimonate), manufactured by Sartomer Company, Inc.; DTS-102, DTS-103, NAT-103, NDS-103 ((4-hydroxynaphtyl)dimethylsulfonium hexafluoroantimonate), TPS-102 (triphenylsulfonium hexafluorophosphate), TPS-103 (triphenylsulfonium hexafluoroantimonate), MDS-103 (4-methoxyphenyldiphenylsulfonium hexafluoroantimonate), MPI-103 (4-methoxyphenyliodonium hexafluoroantimonate), BBI-101 (bis(4-tert-butylphenyl)iodonium tetrafluoroborate), BBI-102 (bis(4-tert-butylphenyl)iodonium hexafluorophosphate), and BBI-103 (bis(4-tert-phenyl)iodonium hexafluoroantimonate), manufactured by Midori Kagaku Co., Ltd.; Degacure K126 (bis[4-(diphenylsulfonio)phenyl]sulfide bis(hexafluorophosphate)), manufactured by degussa Corporation; and Rhodorsil® Photoinitiator 2074, manufactured by Rhodia Inc. The above products may be used alone or in combination of two or more of them.

The photopolymerizable resin may optionally contain a thermoplastic resin and other additives such as an ultraviolet absorber, an antioxidant, a dye, and a processing aid.

Examples of the thermosetting material include silicon-based materials, polydimethylsiloxane (PDMS), (meth)acrylic resins, fluorinated (meth)acrylic resins, polyimide resins, fluorinated polyimide resins, epoxy resins, polyester resins, polyarylate resins, fluorocarbon resins, and deuterides thereof. These materials may be used alone or in a blend. If a blend is used, the blend may have an interpenetrating polymer network (IPN) structure in which the blended materials have three-dimensional networks that penetrate each other. The above materials may also be used in the form of a block copolymer. The thermosetting material may contain a thermal polymerization initiator (thermosetting agent) such as an organic peroxide. Examples of the organic peroxide used include 2,5-dimethylhexane-2,5-dihydroperoxide, 2,5-dimethyl-2,5-di(t-butylperoxy)hexyne-3, di-t-butyl peroxide, t-butylcumyl peroxide, 2,5-dimethyl-2,5-di(t-butylperoxy)hexane, dicumyl peroxide, $\alpha,\alpha'$-bis(t-butylperoxyisopropyl)benzene, n-butyl-4,4'-bis(t-butylperoxy)valerate, 1,1-bis(t-butylperoxy)cyclohexane, 1,1-bis(t-butylperoxy)-3,3,5-trimethylcyclohexane, t-butyl peroxybenzoate, benzoyl peroxide, t-butyl peroxyacetate, methyl ethyl ketone peroxide, 2,5-dimethylhexyl-2,5-bis-peroxybenzoate, butyl hydroperoxide, p-menthane hydroperoxide, p-chlorobenzoyl peroxide, hydroxyheptyl peroxide, chlorohexanone peroxide, octanoyl peroxide, decanoyl peroxide, lauroyl peroxide, cumyl peroxyoctoate, succinic acid peroxide, acetyl peroxide, t-butylperoxy(2-ethylhexanoate), m-toluoyl peroxide, t-butyl peroxyisobutyrate, and 2,4-dichlorobenzoyl peroxide. The above organic peroxides may be used alone or in a mixture. The amount of organic peroxide added is generally 0.1 to 10 parts by weight based on 100 parts by weight of the polymer.

If the resin layer 34 is formed of the photocurable material alone, the photocurable material preferably contain at least two photopolymerization initiators corresponding to light with different wavelengths. The resin layer 34 may be cured using at least two photopolymerization initiators by irradiation with at least two types of light with different wavelengths to achieve the required difference in refractive index between the optical interconnects 34a and the surrounding region 34b. If, on the other hand, the resin layer 34 is formed of the photocurable material and the thermosetting material, these materials preferably contain at least one photopolymetization initiator and at least one thermal polymerization initiator, respectively. Similar effects can be achieved in both cases.

In addition, the photocurable material preferably contains at least one dye that absorbs light in the near-infrared or longer wavelength region, specifically, light with a wavelength of about 760 nm or more. A preferred example is photothermal conversion dyes, which absorb light with a predetermined wavelength to generate heat. These dyes preferably degrade and exhibit decreased absorption of light with the wavelength after being heated. A specific example is photothermal conversion dyes that absorb light with a wavelength of 850 nm to generate heat which degrades the dyes, including cyanine dyes and phthalocyanine dyes.

The most important feature of the optical device 100 is the optical interconnects 34a provided between the optical waveguides 11 and the optical elements 22 and 23; the rest of the structure of the optical device 100 and the materials used for the other portions thereof, for example, are not particularly limited.

The optical waveguides 11 may be composed of, for example, cores formed on or in cladding or optical fibers arranged in parallel on a substrate in waveguide form, and the planar and sectional shapes of the cores and the cladding are not particularly limited. In addition, the optical waveguides 11 may be formed of a known organic or inorganic material that is generally used for cores and cladding in this field (including the photocurable materials and the thermosetting materials mentioned above), preferably with excellent transparency and low optical loss in the signal wavelength region used. Examples of the material used include monomers (or solutions thereof), oligomers (or solutions thereof), and polymer solutions of photocurable materials, thermosetting materials, and thermoplastic materials; a suitable material may be selected in terms of the required properties, such as transparency and heat resistance. In particular, waveguide films formed of organic polymer materials are preferred in terms of ease of handling and processing. Note that the materials for cores and cladding must be selected in relation to each other because cores require a higher refractive index than cladding.

Among the above materials, examples of the monomers include acrylic acid, methacrylic acid, and lower alcohol esters thereof; compounds represented by the following general formula (1):

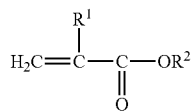

(1)

(wherein $R^1$ is a hydrogen atom or a methyl group; and $R^2$ is an alkyl group having 8 to 20 carbon atoms); di(meth)acrylates; tri(meth)acrylates; and styrene-based monomers such as styrene and divinylbenzene.

An example of a lower alcohol for the lower alcohol esters of acrylic acid and methacrylic acid is a monohydric alcohol having 1 to 5 carbon atoms, preferably a monohydric alcohol having 1 to 3 carbon atoms, more preferably methanol.

In the general formula (1), $R^2$, which indicates a higher alkyl group having 8 to 20 carbon atoms, preferably has 10 to 16 carbon atoms, more preferably 12 to 14 carbon atoms. Though the higher alkyl group $R^2$ may be either a single alkyl group or a mixed alkyl group, mixed alkyl groups having 12 and 13 carbon atoms are most preferable. In this case, the ratio by weight between the alkyl group having 12 carbon atoms and the alkyl group having 13 carbon atoms, that is, the ratio by weight between dodecyl(meth)acrylate and tridecyl(meth) acrylate, is generally 20:80 to 80:20, preferably 40:60 to 60:40.

Examples of di(meth)acrylates include diesters of ethylene glycol and (meth)acrylic acid, diesters of polyethylene glycol and (meth)acrylic acid, and diesters of diols having an alkyl chain with 3 to 6 carbon atoms and (meth)acrylic acid. Examples of tri(meth)acrylates include triesters of triols having an alkyl chain with 3 to 6 carbon atoms and (meth)acrylic acid. The polyethylene glycol component in the diesters of polyethylene glycol and (meth)acrylic acid is represented by the following general formula (2):

(2)

wherein n is preferably 1 to 15, particularly preferably 1 to 10.

The above monomers are generally polymerized or copolymerized to form a layer by curing with heat or light, though the method used is not particularly limited. For heat curing, generally, a polymerization initiator may be added to induce polymerization at 50° C. to 120° C. for 1 to 20 hours. Examples of the polymerization initiator used include organic peroxides such as t-butyl hydroperoxide, di-t-butyl peroxide, lauroyl peroxide, benzoyl peroxide, dimyristyl peroxydicarbonate, t-butyl peroxyacetate, t-butyl peroxy(2-ethylhexanoate), and cumyl peroxyoctoate; and azo compounds such as azobisisobutyronitrile and azobiscyclohexanenitrile. On the other hand, examples of polymerization initiators preferred for light curing include ketals such as benzyl methyl ketal and acetophenone diethyl ketal; ketones such as α-hydroxyketone, Michler's ketone, and α-hydroxycyclohexyl phenyl ketone; benzophenones such as benzophenone; metallocenes such as metallocene; and benzoins such as benzoin isopropyl ether.

The above monomers are preferably used by adding at least one material selected from the group consisting of phosphates, aromatic carboxylates, aliphatic carboxylic acids, aliphatic carboxylates, glycols, and glycol (meth)acrylates to prevent clouding after extended exposure to high temperature and humidity.

Examples of the polymers include polyester resins (crystalline or non-crystalline) such as (meth)acrylic resins ((meth)acrylates), fluorinated (meth)acrylic resins, polycarbonates (PC), polyethylene terephthalate (PET), and polybutylene terephthalate (PBT); polysilanes; polyethersulfones; polynorbornene; cured mixtures of epoxy resins, such as bisphenol A and novolac epoxy resin, and curing agents having an active hydrogen, such as polyaminoamides, modified polyaminoamides, modified aromatic polyamines, modified aliphatic polyamines, modified alicyclic polyamines, and phenols; polyaryls; polyimides (PI); fluorinated polyimides, polycarbodiimides; polyetherimides; polyamideimldes; polyesterimides; polyamides (PA); styrene-based resins such as polystyrene (PS), acrylonitrile-styrene copolymers (AS), methyl methacrylate-styrene copolymers (MS, MMA-St), styrene-butadiene block copolymers (SBS) and acrylonitrile-butadiene-styrene copolymers (ABS) (among them, SBS and ABS excel in impact resistance); polyarylene ethers such as polyphenylene ether; polyarylates (PAR); polyacetals; polyphenylene sulfides; polysulfones; polyether ketones such as polyether ether ketone and polyether ketone ketone; polyvinyl alcohol; polyvinyl pyrrolidone; styrene-ethylene-butadiene-styrene block copolymers (SEBS); and fluorocarbon resins such as vinylidene fluoride resins, hexafluoropropylene resins, and hexafluoroacetone resins. Among them, (meth)acrylates are preferred.

Other examples of transparent resins include polyvinyl chloride (PVC), cycloolefin polymers (available under the trade names of, for example, ARTON, manufactured by JSR Corporation, and ZEONEX®, manufactured by Zeon Corporation), polypropylene (PP), polyethylene (PE), triacetyl cellulose (TAC) resins, polyethersulfones (PES), phenol resins, and polysulfone resins (PSF). Among the above materials, styrene-based resins, particularly MS resins, (meth)acrylate resins, and epoxy resins, can be started from monomers or low-molecular-weight materials.

In addition to copolymers of acrylic acid, methacrylic acid, and lower alcohol esters thereof and styrene-based monomers, for example, transparent resins produced from monomers prepared by partially or completely substituting fluorine atoms for the hydrogen atoms of the monomers described above may be used. Such materials for cores and cladding may be used alone or in any mixture of at least two of them. For optical waveguides having a core held between upper and lower claddings, the claddings are preferably formed of the same material to reduce transmission loss.

The optical waveguides 11 may be formed by any known method. An example of the method used is direct exposure, in which optical waveguides are formed by forming a lower cladding, applying a core material thereto, exposing the applied material using a mask to form a core, and covering the top and side surfaces thereof with an upper cladding. The core material applied to the lower cladding may also be subjected to direct writing through irradiation with, for example, electron beams, ultraviolet beams, or laser beams to form a core. Another example is multilayer extrusion. Though the method used is not particularly limited, imprinting (also called hot embossing or nanoimprinting) is preferably used.

As an imprinting process, either thermal imprinting, in which a thermoplastic or thermosetting material is used as the material for lower claddings, or optical imprinting, in which a photocurable material is used, may be suitably employed. If a thermoplastic material is used, the material may be pressed using a mold at its glass transition temperature or higher and cooled and cured before being released from the mold, thereby forming a lower cladding having an accurate mold pattern. If a thermosetting material is used, the material may be pressed using a mold and cured with heat before being released from the mold. If a photocurable material is used, the material may be pressed using a mold and cured with light before being released from the mold. In any case, a lower cladding can be cured before being released from a mold so that a core having a required pattern can be formed without causing distortion.

Use of imprinting advantageously eliminates the need for a development step in photolithography to allow efficient production with simple steps. In addition, imprinting contributes to cost reduction because it requires no beam system and thus reduces equipment cost, and does not require expensive resist materials such as chemically amplified resist materials. Furthermore, imprinting enables direct pattern transfer to easily reproduce designed three-dimensional patterns and form optical waveguides having various cross-sections that are difficult to form by photolithography, including curved surfaces. For imprinting, however, optical waveguides must be designed with consideration given to dimensional changes due to contraction after heat or light curing, which vary according to the material used. Attention must also be given to the dependence of resolution on the mold used and the occurrence of a residual resin in the mold.

In the present invention, as shown in the drawing, the direction in which light travels must be changed by providing, for example, mirrors 50, optical pins, or slit structures having a similar effect at positions of the optical waveguides 11 where signal light is transmitted to/from the optical elements 22 and 23. The mirrors 50 may be provided at a certain angle, for example 45° C., to the direction in which light travels. The mirrors 50 may be formed by, for example, dicing using a blade or laser processing, and may be coated with, for example, gold. If necessary, a hard coat and a moisture barrier layer (not shown) may be formed on the optical waveguides 11.

In the present invention, optical elements include light-emitting elements, such as the VCSEL 22, and photodetectors, such as the PD 23. In the embodiment shown in the drawing, external signal light transmitted through the optical fiber (not shown) and the connector 40 propagates through the optical waveguide 11 and is input to the PD 23 via the mirrors 50. The PD 23 then converts the light to an electric signal and transmits it to the IC-chip mounting substrate 20.

As shown in the drawing, the IC-chip mounting substrate 20 is flip-chip mounted on the printed circuit board 10, on which the optical waveguides 11 are formed, with the bump electrodes 31 and the soldering balls 32 disposed therebetween to ensure the reliability and heat resistance of the joints. In this case, the IC-chip mounting substrate 20 and the printed circuit board 10 are electrically connected through the solder balls 32. The solder balls 32 have a self-aligning effect to inhibit misalignment in mounting to an acceptable level, thus contributing to the reduction of connection loss. Among several soldering processes, reflow soldering is preferred in the present invention.

The optical device 100 is produced by flip-chip mounting the IC-chip mounting substrate 20 on the printed circuit board 10 having the optical waveguides 11 by a general method, providing a photocurable material alone or in combination with a thermosetting material between the printed circuit board 10 and the IC-chip mounting substrate 20 to form the resin layer 34, and forming the optical interconnects 34a in the resin layer 34.

If a photocurable material is used alone, the resin layer 34 is formed by providing the photocurable material between the optical waveguides 11 and the optical elements 22 and 23, partially irradiating the photocurable material with light to form the optical interconnects 34a, and secondarily irradiating the overall photocurable material with light to cure the overall resin layer 34. The resin layer 34 may optionally be heated in the secondary light irradiation for curing the overall resin layer 34. If the photocurable material is used in combination with a thermosetting material, the resin layer 34 is formed by providing a mixture of the photocurable material and the thermosetting material between the optical waveguides 11 and the optical elements 22 and 23, partially irradiating the mixture with light to form the optical interconnects 34a, and heating the overall mixture to cure the overall resin layer 34.

If the photocurable material contains at least one dye that absorbs light in the near-infrared or longer wavelength region, the optical interconnects 34a may be formed by forming higher-refractive-index areas through irradiation with light in the near-infrared or longer wavelength region before curing the areas through irradiation with visible or ultraviolet light or heat treatment. The overall resin layer 34 may then be cured by secondary light irradiation and heat treatment or heat treatment.

The partial light irradiation for forming the optical interconnects 34a may be performed with light emitted from the optical elements 22 and 23 or light that is emitted from an external light source, such as a laser, to reach the optical elements 22 and 23 through the optical waveguides 11. This method allows the optical interconnects 34a to agree exactly with the optical paths between the optical waveguides 11 and the optical elements 22 and 23, thus enabling reliable, low-loss optical connection therebetween. The optical interconnects 34a are preferably formed with both light emitted from the optical elements 22 and 23 and light that is emitted from an external light source to reach the optical elements 22 and 23 through the optical waveguides 11. Use of bidirectionally propagating light allows the self-alignment of the optical paths so that the optical device 100 can achieve excellent connection reliability.

EXAMPLES

The present invention is specifically described with examples below.

Example 1

First, the 45° mirrors 50 were formed in advance by dicing at positions of the optical waveguides 11 which correspond to the optical elements (VCSEL 22 and PD 23) mounted on the IC-chip mounting substrate 20 to optically connect the optical waveguides 11 and the VCSEL 22 and PD 23. Subsequently, a printed circuit board (FR4) 10 was bonded to the optical waveguides 11 with an epoxy adhesive to prepare the printed circuit board 10, which included the optical waveguides 11 as intermediate layers. A top hole was then formed using a drill machine at a position of the printed circuit board 10 which corresponds to the optical paths between the optical waveguides 11 and the VCSEL 22 and PD 23. The printed circuit board 10, which had an electrode pattern formed in advance, was mounted on the IC-chip mounting substrate 20, which had the VCSEL 22 and PD 23, by bonding the electrodes 31 using the solder balls 32 disposed under the substrate 20. The solder balls 32 were heated using a solder reflow oven, and the maximum temperature that the solder balls 32 reached was 300° C. Thus the VCSEL 22 and PD 23 could be relatively easily mounted on the printed circuit board 10 by soldering.

The space between the 45° mirrors 50 of the optical waveguides 11 and the VCSEL 22 and PD 23 was then filled using a dispenser with an epoxy underfill material prepared by adding two photopolymerization initiators to a photocurable material.

The underfill material was partially cured for five minutes by both light with a wavelength of 850 nm emitted from the VCSEL 22 and light with a wavelength of 850 nm that was emitted from an external laser source to reach the PD 23 through the optical waveguide 11 to form an optical waveguide structure including the optical interconnects 34a as cores (core diameter=60 μm). The overall underfill material was then irradiated with light with a wavelength of 450 nm for ten minutes to cure the overall resin layer 34.

The optical interconnects 34a thus prepared exhibited an optical loss of 1.2 dB, which indicates that the optical interconnects 34a had excellent light connection characteristics.

Example 2

After the VCSEL 22 and PD 23 were mounted on the printed circuit board 10 as in Example 1, the space between the 45° mirrors 50 of the optical waveguides 11 and the VCSEL 22 and PD 23 was filled using a dispenser with an epoxy underfill material prepared by mixing a photocurable material and a thermosetting material.

The underfill material was partially cured for five minutes by both light with a wavelength of 850 nm emitted from the VCSEL 22 and light with a wavelength of 850 nm that was emitted from an external laser source to reach the PD 23 through the optical waveguide 11 to form an optical waveguide structure including the optical interconnects 34a as cores (core diameter=60 μm). The overall underfill material was then heated at 150° C. for 30 minutes to cure the overall resin layer 34.

The optical interconnects 34a thus prepared exhibited an optical loss of 1.0 dB, which indicates that the optical interconnects 34a had excellent light connection characteristics.

Comparative Example

The VCSEL 22 and PD 23 were mounted on the printed circuit board 10 as in Examples 1 and 2, and no underfill material was provided in the space between the 45° mirrors 50 of the optical waveguides 11 and the VCSEL 22 and PD 23. The optical loss was measured to be 18 dB.

The above results proved that an optical device including optical interconnects according to the present invention exhibits a significantly lower optical loss than those including no optical interconnects.

What is claimed is:

1. A method for producing an optical device comprising: an optical waveguide; an optical element; and a resin layer disposed between the optical waveguide and the optical element, the resin layer comprising a photocurable material and including an optical interconnect for optically connecting the optical waveguide and the optical element, the optical interconnect having a higher refractive index than a region of the resin layer around the optical interconnect, which comprises:

providing the photocurable material between the optical waveguide and the optical element;

partially irradiating the photocurable material with light to form the optical interconnect; and secondarily irradiating the overall photocurable material with light to cure the overall resin layer.

2. The method for producing the optical device according to claim 1, wherein the partial irradiation is carried out with light emitted from the optical element.

3. The method for producing the optical device according to claim 1, wherein the partial irradiation is carried out with light that is emitted from an external light source to reach the optical element through the optical waveguide.

4. The method for producing the optical device according to claim 1, wherein the partial irradiation is simultaneously carried out with both light emitted from the optical element and light that is emitted from an external light source to reach the optical element through the optical waveguide.

5. A method for producing an optical device comprising: an optical waveguide; an optical element; and a resin layer disposed between the optical waveguide and the optical element, the resin layer comprising a photocurable material and a thermosetting material and including an optical interconnect for optically connecting the optical waveguide and the optical element, the optical interconnect having a higher refractive index than a region of the resin layer around the optical interconnect, which comprises:

providing a mixture of the photocurable material and the thermosetting material between the optical waveguide and the optical element;

partially irradiating the mixture with light to form the optical interconnect; and heating the overall mixture to cure the overall resin layer.

6. The method for producing the optical device according to claim 5, wherein the partial irradiation is carried out with light emitted from the optical element.

7. The method for producing the optical device according to claim 5, wherein the partial irradiation is carried out with light that is emitted from an external light source to reach the optical element through the optical waveguide.

8. The method for producing the optical device according to claim 5, wherein the partial irradiation is simultaneously carried out with both light emitted from the optical element and light that is emitted from an external light source to reach the optical element through the optical waveguide.

* * * * *